(12) United States Patent
Bhatia et al.

(10) Patent No.: US 11,328,964 B2
(45) Date of Patent: May 10, 2022

(54) PRESCRIPTIVE ANALYTICS IN HIGHLY COLLINEAR RESPONSE SPACE

(71) Applicant: Applied Materials, Inc., Santa Clara, CA (US)

(72) Inventors: Sidharth Bhatia, Santa Cruz, CA (US); Jie Feng, Milpitas, CA (US); Dermot Cantwell, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/599,962

(22) Filed: Oct. 11, 2019

(65) Prior Publication Data

US 2020/0193531 A1   Jun. 18, 2020

Related U.S. Application Data

(60) Provisional application No. 62/779,097, filed on Dec. 13, 2018.

(51) Int. Cl.
*G05B 13/02* (2006.01)
*H01L 21/66* (2006.01)
(Continued)

(52) U.S. Cl.
CPC ............ *H01L 22/12* (2013.01); *G06N 3/08* (2013.01); *G06Q 50/04* (2013.01); *H01L 21/02* (2013.01);
(Continued)

(58) Field of Classification Search
CPC .......... H01J 37/32568; H01J 37/32458; G01B 11/0616; G01B 7/105; G05B 19/00;
(Continued)

(56) References Cited

U.S. PATENT DOCUMENTS 5,096,298 A * 3/1992 Isobe .................... G01N 21/41
356/369
7,201,936 B2    4/2007 Schwarm et al.
(Continued)

FOREIGN PATENT DOCUMENTS

JP   2013138121 A   7/2013
WO      0118845 A1   3/2001

OTHER PUBLICATIONS

International Search Report and Written Opinion dated Apr. 13, 2020, on application No. PCT/US2019/065781.
(Continued)

*Primary Examiner* — Tuan A Vu
(74) *Attorney, Agent, or Firm* — Lowenstein Sandler LLP

(57) ABSTRACT

Methods, systems, and non-transitory computer readable medium are described for prescriptive analytics in highly collinear response space. A method includes receiving film property data associated with manufacturing parameters of manufacturing equipment. The method further includes determining that the film property data is correlated and is different from target data. The method further includes selecting a set of data points of the film property data that are orthogonal to the target data. The method further includes performing feature extraction on the set of data points. The method further includes determining, based on the feature extraction, updates to one or more of the manufacturing parameters to meet the target data.

20 Claims, 7 Drawing Sheets

(51) Int. Cl.
*G06Q 50/04* (2012.01)
*H01L 21/67* (2006.01)
*G06N 3/08* (2006.01)
*H01L 21/02* (2006.01)
*G11C 11/16* (2006.01)
*H01J 37/32* (2006.01)
*G01B 7/06* (2006.01)
*G06T 7/00* (2017.01)
*G01N 21/41* (2006.01)

(52) U.S. Cl.
CPC ........ *H01L 21/67253* (2013.01); *G01B 7/105* (2013.01); *G01N 21/41* (2013.01); *G06T 7/0004* (2013.01); *G11C 11/1675* (2013.01); *H01J 37/32458* (2013.01); *Y02P 90/30* (2015.11)

(58) Field of Classification Search
CPC ..... G05B 13/024; G03F 7/70633; G03F 7/00; G03F 7/70625; G06T 7/0004; G06T 7/0008; H01L 21/3065; H01L 21/67282; H01L 21/67253; H01L 22/12; C23C 16/52; G06Q 50/04; G06N 3/08; G11C 11/1675; G01N 21/41
See application file for complete search history.

(56) References Cited

U.S. PATENT DOCUMENTS

| | | | | |
|---|---|---|---|---|
| 10,580,827 | B1* | 3/2020 | Watts | G11C 11/1675 |
| 2003/0049376 | A1* | 3/2003 | Schwarm | G05B 19/00 |
| | | | | 427/255.28 |
| 2003/0049390 | A1* | 3/2003 | Shanmugasundram | |
| | | | | C23C 16/52 |
| | | | | 427/585 |
| 2003/0207476 | A1* | 11/2003 | Eriguchi | H01L 21/3065 |
| | | | | 438/16 |
| 2006/0167651 | A1* | 7/2006 | Zangooie | G05B 13/024 |
| | | | | 702/179 |
| 2007/0163712 | A1* | 7/2007 | Gotkis | G01B 7/105 |
| | | | | 156/345.1 |
| 2008/0183411 | A1* | 7/2008 | Funk | G01B 11/0616 |
| | | | | 702/84 |
| 2012/0199287 | A1 | 8/2012 | Vuong et al. | |
| 2014/0019097 | A1* | 1/2014 | Bakeman | G03F 7/70625 |
| | | | | 703/1 |
| 2017/0109646 | A1* | 4/2017 | David | G03F 7/70633 |
| 2017/0314912 | A1* | 11/2017 | Krishnan | G03F 7/00 |
| 2018/0253015 | A1 | 9/2018 | Ypma et al. | |
| 2018/0309061 | A1* | 10/2018 | Chun | G06T 7/0008 |
| 2018/0328868 | A1* | 11/2018 | Bykanov | H01L 21/67282 |
| 2020/0043710 | A1* | 2/2020 | Meng | H01J 37/32458 |
| 2020/0051235 | A1* | 2/2020 | Majumdar | G06T 7/0004 |
| 2020/0091017 | A1* | 3/2020 | Musselman | H01J 37/32568 |

OTHER PUBLICATIONS

Kumar, Sricharan et al., "Bootstrap Prediction Intervals in Non-Parametric Regression with Applications to Anomaly Detection" Aug. 12, 2012, https://ntrs.nasa.gov/archive/nasa/casi.ntrs.nasa.gov/20130014367.pdf.

Abbas Khosravis et al., "Comprehensive Review of Neural Network-Based Prediction Intervals and New Advances" IEEE Transactions on Neural Networks, vol. 22, No. 9, Sep. 2011.

Moyne, James and Jimmy Iskandar. "Big data analytics for smart manufacturing: Case studies in semiconductor manufacturing." (2017).

Support Vector Machine (SVM) Explorer, Ploty Dash, https://dash-gallery.plotly.host/dash-svm/ retrieved Oct. 11, 2019.

Robert Cappel et al., "Yield and cost challenges at 16nm and beyond" https://web.archive.org/web/20160209092241/http://electroiq.com/) Retrieved Oct. 11, 2019.

* cited by examiner

US 11,328,964 B2

PRESCRIPTIVE ANALYTICS IN HIGHLY COLLINEAR RESPONSE SPACE

RELATED APPLICATION

This application claims the benefit of Provisional Application No. 62/779,097, filed Dec. 13, 2018, the entire contents of which are incorporated by reference in their entirety.

TECHNICAL FIELD

The present disclosure relates to prescriptive analytics, and, more particularly, prescriptive analytics in a highly collinear response space.

BACKGROUND

Manufacturing processes and manufacturing equipment to produce products (e.g., in semiconductor and display industries) can be complex. Determining updates to parameters of the manufacturing processes and manufacturing equipment to meet target properties of the products can be time consuming and can depend on domain expertise of an administrator of the manufacturing facility.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method may include receiving film property data associated with manufacturing parameters of manufacturing equipment. The method further includes determining that the film property data is correlated and is different from target data. The method further includes selecting, by a processing device, a set of data points of the film property data that are orthogonal to the target data. The method further includes performing, by the processing device, feature extraction on the set of data points. The method further includes determining, based on the feature extraction, updates to one or more of the manufacturing parameters to meet the target data.

In another aspect of the disclosure, a system includes a memory and a processing device coupled to the memory. The processing device is to receive film property data associated with manufacturing parameters of manufacturing equipment and determine that the film property data is correlated and is different from target data. The processing device is further to select a set of data points of the film property data that are orthogonal to the target data and perform feature extraction on the set of data points. The processing device is further to determine, based on the feature extraction, updates to one or more of the manufacturing parameters to meet the target data.

In another aspect of the disclosure, a non-transitory computer readable medium having instructions stored thereon, which, when executed by a processing device, cause the processing device to receive film property data associated with manufacturing parameters of manufacturing equipment and determine that the film property data is correlated and is different from target data. The processing device is further to select a set of data points of the film property data that are orthogonal to the target data and perform feature extraction on the set of data points. The processing device is further to determine, based on the feature extraction, updates to one or more of the manufacturing parameters to meet the target data.

BRIEF DESCRIPTION OF THE DRAWINGS

The present disclosure is illustrated by way of example, and not by way of limitation in the figures of the accompanying drawings.

DETAILED DESCRIPTION

Figure 1:
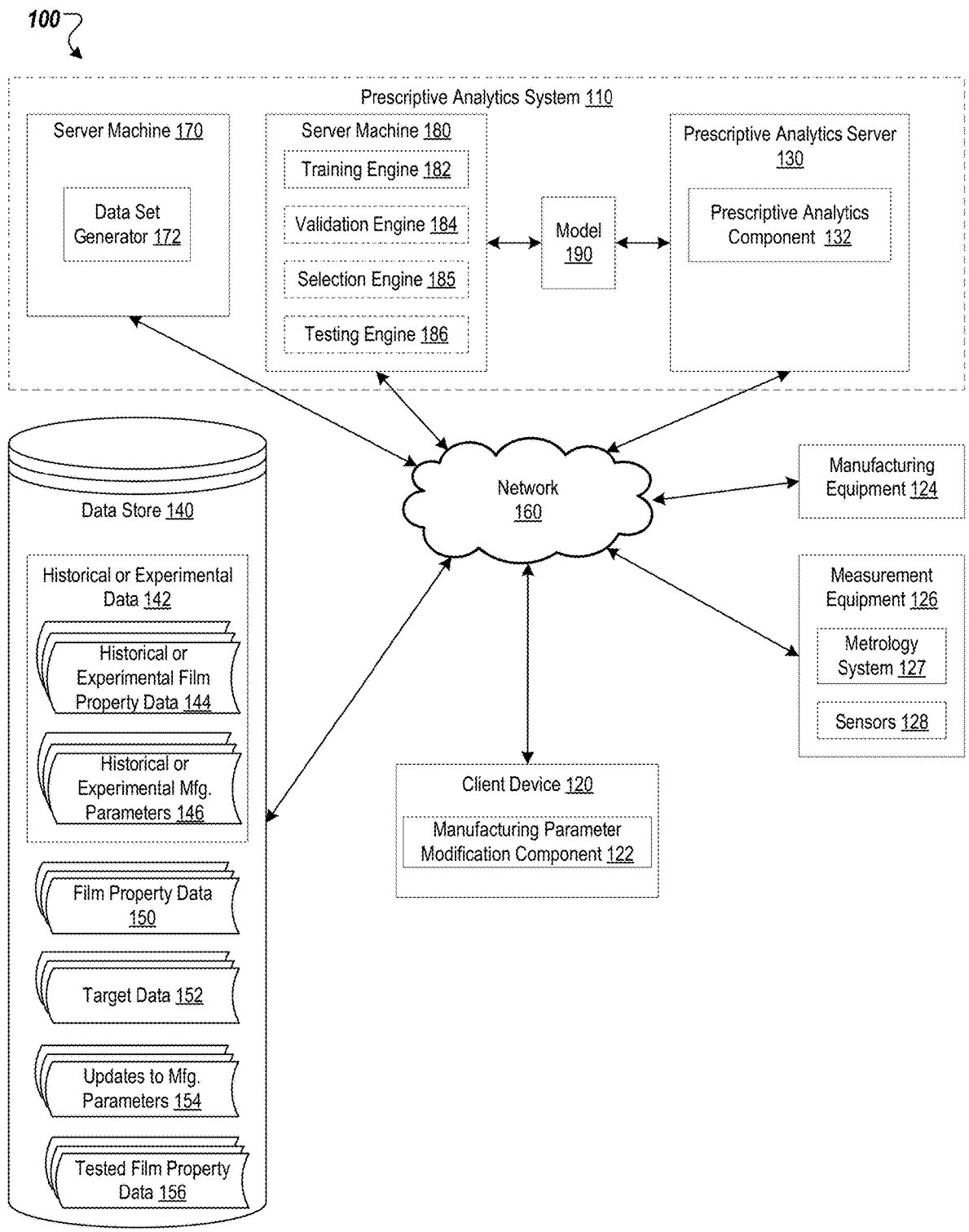
FIG. 1 is a block diagram illustrating an exemplary system architecture, according to certain embodiments.

Described herein are technologies directed to prescriptive analytics in highly collinear response space. Manufacturing equipment (e.g., semiconductor or display processing tools) perform manufacturing processes to produce products (e.g., semiconductor wafers, semiconductor displays, etc.) that have resulting property data (e.g., film property data). The resulting property data may be compared against target data (e.g., target property data, specification). Responsive to the resulting property data not meeting target data, manufacturing parameters (e.g., hardware parameters, process parameters) of the manufacturing equipment may be updated to attempt to meet the target data. Conventionally, updating of manufacturing parameters to attempt to meet target data may depend on domain expertise of an administrator, may be ad hoc, and may be limited. Through trial and error of updating manufacturing parameters, the administrator may decide how to update manufacturing parameters to attempt to meet target data. The administrator may be unable to update the manufacturing parameters to meet target data. The target data may include two or more properties. For example, the target data may be one or more of multi-parameter, multi-objective optimization, a constrained optimization problem, an un-constrained optimization problem, etc. Conventionally, the administrator may be limited to choosing one property of the target data and then update manufacturing parameters to try to meet that one property of the target data. While attempting to make one property of the resulting property data meet the target data, other properties of the resulting property data may not meet target data and may increase in deviation from the target data. Conventionally, the administrator may be limited to the amount or type of manufacturing parameters that can be updated (e.g., that can simultaneously be considered for updating). The administrator may be unable to update the manufacturing parameters to meet target data that is one or more of multi-parameter, multi-objective optimization, constrained optimization problem, un-constrained optimization problem, etc.

Property data of products may be correlated (e.g. collinear film property data). For example, in a graph where a first axis is a first property and a second axis that is a second property, property data may form a line. The line may be substantially parallel to (e.g., offset from) target data. Conventionally, an administrator is unable to adjust manufacturing parameters so that correlated property data (e.g., collinear film property data) meets target data.

The devices, systems, and methods disclosed herein use prescriptive analytics in highly collinear response space to determine updates to one or more manufacturing parameters (e.g., process parameters, equipment parameters, hardware design changes, etc.) to meet target data. A processing device receives film property data associated with manufacturing parameters of manufacturing equipment and determines that the film property data is correlated and is different from target data (e.g., does not meet the target data, is unable to meet the target data, is offset from the target data, etc.). The processing device selects a set of data points of the film property data that are orthogonal to the target data and performs feature extraction on the set of data points. The processing device determines, based on the feature extraction, updates to one or more of the manufacturing parameters to meet the target data.

In some embodiments, a machine learning model may be trained using data input (e.g., historical or experimental manufacturing parameters) and target output (e.g., historical or experimental film property data) that corresponds to the data input. An inverted solution may be obtained from the trained machine learning model based on target data. The inverted solution may include updates to the manufacturing parameters. In some embodiments, to obtain the inverted solution, the trained machine learning model may be inverted, target data may be input into the inverted trained machine learning model, and updates to the manufacturing parameters to meet the target data may be output by the inverted machine learning model.

In some embodiments, the updates to the manufacturing parameters may be displayed via a graphical user interface. In some embodiments, the updates to the manufacturing parameters may be implemented to meet the target data.

Aspects of the present disclosure result in technological advantages of significant reduction in energy consumption (e.g., battery consumption), required bandwidth, processor overhead, and so forth. In some embodiments, the technological advantages result from determining updates to manufacturing parameters to meet target data without performing ad hoc trial and error which uses domain expertise of an administrator. Updates to the manufacturing parameters to meet the target data can be determined using less energy, less bandwidth, less processor overhead than ad hoc trial and error relying on a user's domain expertise. The updates to the manufacturing parameters determined via the present disclosure can produce products with property data that is closer to the target data than conventional approaches. Conventionally, an administrator may be unable to determine updates to manufacturing parameters to meet target data which may result in products that do not meet specification. The updates to the manufacturing parameters, determined by the embodiments described herein, can produce products with property data to that meets the different properties of the target data (e.g., that meet specification, instead of just attempting to be close to one property of the target data).

FIG. 1 is a block diagram illustrating an exemplary system architecture 100, according to certain embodiments. The system architecture 100 includes client device 120, manufacturing equipment 124, measurement equipment 126, a prescriptive analytics server 130, and a data store 140. The prescriptive analytics server 130 may be part of a prescriptive analytics system 110. Prescriptive analytics system 110 may further include server machines 170 and 180.

The measurement equipment 126 may include one or more of a metrology system 127 or sensors 128. The measurement equipment 126 may determine (e.g., via metrology equipment 127) the film property data (e.g., historical or experimental film property data 144, film property data 150, tested film property data 156) of products (e.g., wafers) produced by the manufacturing equipment 124. The measurement equipment 126 may determine (e.g., via sensors 128) the manufacturing parameters (e.g., historical or experimental manufacturing parameters 146, etc.) associated with the manufacturing equipment 124.

The client device 120, manufacturing equipment 124, measurement equipment 126, prescriptive analytics server 130, data store 140, server machine 170, and server machine 180 may be coupled to each other via a network 160 for determining updates to manufacturing parameters 154 to meet target data 152. In some embodiments, network 160 is a public network that provides client device 120 with access to the prescriptive analytics server 130, data store 140, and other publically available computing devices. In some embodiments, network 160 is a private network that provides client device 120 with access to the prescriptive analytics server 130, data store 140, and other privately available computing devices. Network 160 may include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 may include a computing device such as personal computers (PCs), laptops, mobile phones, smart phones, tablet computers, netbook computers, network connected televisions ("smart TV"), network-connected media players (e.g., Blu-ray player), a set-top-box, over-the-top (OTT) streaming devices, operator boxes, etc. The client device 120 may be capable of receiving film property data (e.g., historical or experimental data 142, film property data 150, tested film property data 156) from measurement equipment 126, receiving updates to manufacturing parameters 154 from the prescriptive analytics system 110, etc. via the network 160. The client device 120 may be capable of transmitting film property data (e.g., historical or experimental data 142, film property data 150, target data 152, tested film property data 156) to the prescriptive analytics system 110, transmitting the updates to manufacturing parameters 154 to the manufacturing equipment 124, etc. via the network 160. In some embodiments, client device 120 may modify manufacturing parameters (e.g., process parameters, hardware parameters, etc.) of the manufacturing equipment 124 based on the updates to manufacturing parameters 154. Each client device 120 may include an operating system that allows users to one or more of generate, view, or edit data (e.g., target data 152, updates to manufacturing parameters 154, tested film property data 156, etc.)

The client device 120 may include a manufacturing parameter modification component 122. Manufacturing parameter modification component 122 may receive user input (e.g., via a graphical user interface displayed via the client device 120) of target data 152. Target data 152 may include property data (e.g., film property data). In some embodiments, client device 120 transmits the target data 152 to prescriptive analytics server 130 and the client device 120 receives the updates to manufacturing parameters 154 to meet the target data 152 from the prescriptive analytics server 130. The client device 120 may cause the manufacturing parameters of the manufacturing equipment 124 to be updated based on the updates to manufacturing parameters 154 (e.g., transmit the updates to manufacturing parameters 154 to the manufacturing equipment 124, implement the updates to the manufacturing parameters 154). The client device 120 may receive tested film property data 156 responsive to the updates to the manufacturing parameters being implemented by the manufacturing equipment 124. The client device 120 may transmit the tested film property data 156 to the prescriptive analytics system 110 (e.g., prescriptive analytics server 130) for the update of a trained machine learning model 190.

The prescriptive analytics server 130 may include one or more computing devices such as a rackmount server, a router computer, a server computer, a personal computer, a mainframe computer, a laptop computer, a tablet computer, a desktop computer, graphics processing unit (GPU), accelerator application-specific integrated circuit (ASIC) (e.g., tensor processing unit (TPU)), etc. The prescriptive analytics server 130 may include a prescriptive analytics component 132. In some embodiments, the prescriptive analytics component 132 may use historical or experimental data 142 to determine updates to manufacturing parameters 154 to meet target data 152. Historical or experimental data 142 may include historical data, experimental data, or a combination thereof. Experimental data may include design of experiment (DOE) data. In some embodiments, the prescriptive analytics component 132 may use a trained machine learning model 190 to determine updates to manufacturing parameters 154 to meet target data 152. The trained machine learning model 190 may learn key process and hardware parameters. Determining, by the trained machine learning model 190, updates to manufacturing parameters 154 may include prescribing, by the trained machine learning model 190, optimal operating conditions (e.g., process parameters) and/or space (e.g., hardware parameters).

The prescriptive analytics component 132 may receive (e.g., retrieve from the data store 140) film property data 150 associated with manufacturing parameters of manufacturing equipment 124, determine the film property data 150 is correlated and is different from target data 152, and determine updates to manufacturing parameters 154 to meet the target data 152. In some embodiments, the prescriptive analytics component 132 determines updates to manufacturing parameters 154 by selecting a set of data points of the film property data 150 that are orthogonal to the target data 152 and performing feature extraction on the set of data points, where the updates to manufacturing parameters 154 are based on the feature extraction. In some embodiments, an inverted solution (e.g., updates to the manufacturing parameters) may be obtained from the trained machine learning model based on target data. The inverted solution may include updates to the manufacturing parameters. In some embodiments, to obtain the inverted solution, the prescriptive analytics component 132 determines updates to manufacturing parameters 154 by providing target data 152 to a trained machine learning model. For example, an inverted solution (e.g., updates to the manufacturing parameters 154) may be obtained from the trained machine learning model based on target data 152. In some embodiments, the prescriptive analytics component 132 determines updates to manufacturing parameters 154 by providing target data 152 into an inverted trained machine learning model (e.g., model 190 that has been trained and inverted), obtaining outputs from the inverted trained machine learning model, and extracting updates to manufacturing parameters 154 from the outputs. The inverted trained machine learning model may select the set of data points of the film property data 150 that are orthogonal to the target data 152 and perform the feature extraction on the set of data points, where the output of the inverted trained machine learning model (e.g., updates to manufacturing parameters 154) is based on the feature extraction.

Data store 140 may be a memory (e.g., random access memory), a drive (e.g., a hard drive, a flash drive), a database system, or another type of component or device capable of storing data. Data store 140 may include multiple storage components (e.g., multiple drives or multiple databases) that may span multiple computing devices (e.g., multiple server computers). The data store 140 may store one or more of historical or experimental data 142, film property data 150, target data 152, updates to manufacturing parameters 154, or tested film property data 156. The historical or experimental data 142 may include historical or experimental film property data 144 and historical or experimental manufacturing parameters 146 over a period of time or for a plurality of runs of the manufacturing equipment 124. Each instance of historical or experimental film property data 144 may correspond to a respective instance of historical or experimental manufacturing parameters 146 (e.g., the instance of historical or experimental manufacturing parameters 146 used by the manufacturing equipment 124 to produce products with the historical or experimental film property data 144). Each instance of tested film property data 156 may correspond to a respective instance of updates to manufacturing parameters 154 (e.g., the instance of updates to manufacturing parameters 154 used by the manufacturing equipment 124 to produce products with the tested film property data 156).

In some embodiments, manufacturing parameters include one or more of settings or components (e.g., size, type, etc.) of the manufacturing equipment 124. Manufacturing parameters may include one or more of temperature (e.g., heater temperature), spacing (SP), pressure, high frequency radio frequency (HFRF), voltage of electrostatic chuck (ESC), current, a first precursor, a first dilutant, a second dilutant, a first reactant, a second reactant, a second precursor, etc.

In some embodiments, film property data includes wafer spatial film properties based on measurement equipment data (e.g., retrieved from measurement equipment 126 coupled to the manufacturing equipment 124). Film property data may include one or more of dielectric constant, dopant concentration, growth rates, density, etc.

In some embodiments, the client device 120 may store target data 152 and tested film property data 156 in the data store 140 and the prescriptive analytics server 130 may retrieve the target data 152 and tested film property data 156 from the data store 140. In some embodiments, the prescriptive analytics server 130 may store updates to manufacturing parameters 154 in the data store 140 and the client device 120 may retrieve the updates to manufacturing parameters 154 from the data store 140.

In some embodiments, prescriptive analytics system 110 further includes server machine 170 and server machine 180. The server machines 170 and 180 may be one or more computing devices (such as a rackmount server, a router computer, a server computer, a personal computer, a mainframe computer, a laptop computer, a tablet computer, a desktop computer, etc.), GPUs, ASICs (e.g., TPUs), data stores (e.g., hard disks, memories databases), networks, software components, or hardware components.

Server machine 170 includes a data set generator 172 that is capable of generating data sets (e.g., a set of data inputs and a set of target outputs) to train, validate, or test a machine learning model 190. Some operations of data set generator 172 are described in detail below with respect to FIGS. 2 and 6. In some embodiments, the data set generator 172 may partition the historical or experimental data 142 into a training set (e.g., sixty percent of the historical or experimental data 142), a validating set (e.g., twenty percent of the historical or experimental data 142), and a testing set (e.g., twenty percent of the historical or experimental data 142). In some embodiments, the prescriptive analytics component 132 generates multiple sets of features. For example a first set of features may be a first set of manufacturing parameters that correspond to each of the data sets (e.g., training set, validation set, and testing set) and a second set of features may be a second set of manufacturing parameters (e.g., different from the first set of manufacturing parameters) that correspond to each of the data sets.

Server machine 180 includes a training engine 182, a validation engine 184, selection engine, and a testing engine 186. An engine (e.g., training engine 182, a validation engine 184, selection engine, and a testing engine 186) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 may be capable of training a machine learning model 190 using one or more sets of features associated with the training set from data set generator 172. The training engine 182 may generate multiple trained machine learning models 190, where each trained machine learning model 190 corresponds to a distinct set of features of the training set. For example, a first trained machine learning model may have been trained using all features (e.g., X1-X5), a second trained machine learning model may have been trained using a first subset of the features (e.g., X1, X2, X4), and a third trained machine learning model may have been trained using a second subset of the features (e.g., X1, X3, X4, and X5) that may partially overlap the first subset of features.

The validation engine 184 may be capable of validating a trained machine learning model 190 using a corresponding set of features of the validation set from data set generator 172. For example, a first trained machine learning model 190 that was trained using a first set of features of the training set may be validated using the first set of features of the validation set. The validation engine 184 may determine an accuracy of each of the trained machine learning models 190 based on the corresponding sets of features of the validation set. The validation engine 184 may discard trained machine learning models 190 that have an accuracy that does not meet a threshold accuracy. In some embodiments, the selection engine 185 may be capable of selecting one or more trained machine learning models 190 that have an accuracy that meets a threshold accuracy. In some embodiments, the selection engine 185 may be capable of selecting the trained machine learning model 190 that has the highest accuracy of the trained machine learning models 190.

The testing engine 186 may be capable of testing a trained machine learning model 190 using a corresponding set of features of a testing set from data set generator 172. For example, a first trained machine learning model 190 that was trained using a first set of features of the training set may be tested using the first set of features of the testing set. The testing engine 186 may determine a trained machine learning model 190 that has the highest accuracy of all of the trained machine learning models based on the testing sets.

The machine learning model 190 may refer to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. The machine learning model 190 may use one or more of linear regression, random forest, neural network (e.g., artificial neural network), etc.

The trained machine learning model 190 may be inverted (e.g., by prescription analytics component 132, etc.). Prescription analytics component 132 may provide target data 152 (e.g., target film property data) as input to the inverted trained machine learning model 190 and may run the inverted trained machine learning model 190 on the input to obtain one or more outputs. As described in detail below with respect to FIG. 5, prescriptive analytics component 132 may be capable of extracting updates to manufacturing parameters 154 to meet the target data 152 from the output of the trained machine learning model 190 and may extract confidence data from the output that indicates a level of confidence that the one or more products produced using the updates to manufacturing parameters 154 are to meet the target data 152 (e.g., are to be within specification). The prescriptive analytics component 132 may use the confidence data to decide whether to cause the updates to manufacturing parameters 154 to be implemented by the manufacturing equipment 124.

The confidence data may include or indicate a level of confidence of products meeting the target data 152 that are produced using updates to manufacturing parameters 154. In one example, the level of confidence is a real number between 0 and 1 inclusive, where 0 indicates no confidence of products meeting the target data 152 and 1 indicates absolute confidence of the products meeting the target data 152.

For purpose of illustration, rather than limitation, aspects of the disclosure describe the training of a machine learning model using historical or experimental data 142, inverting the trained machine learning model, and inputting target data 152 into the inverted trained machine learning model to determine updates to manufacturing parameters 154. In other implementations, a heuristic model or rule-based model is used to determine updates to manufacturing parameters 154 (e.g., without using a trained machine learning model). Prescriptive analytics component 132 may monitor historical or experimental data 142. Any of the information described with respect to data inputs 210 of FIG. 2 may be monitored or otherwise used in the heuristic or rule-based model.

In some embodiments, the functions of client device 120, prescriptive analytics server 130, server machine 170, and server machine 180 may be provided by a fewer number of machines. For example, in some embodiments server machines 170 and 180 may be integrated into a single machine, while in some other embodiments, server machine 170, server machine 180, and prescriptive analytics server 130 may be integrated into a single machine.

In general, functions described in one embodiment as being performed by client device 120, prescriptive analytics server 130, server machine 170, and server machine 180 can also be performed on prescriptive analytics server 130 in other embodiments, if appropriate. In addition, the functionality attributed to a particular component can be performed by different or multiple components operating together. For example, in some embodiments, the prescriptive analytics server 130 may transmit the updates to manufacturing parameters 154 to the manufacturing equipment 124. In another example, client device 120 may determine the updates to manufacturing parameters 154 based on output from the inverted trained machine learning model.

In addition, the functions of a particular component can be performed by different or multiple components operating together. One or more of the prescriptive analytics server 130, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Although embodiments of the disclosure are discussed in terms of updates to manufacturing parameters 154 of manufacturing equipment 124 in manufacturing facilities (e.g., semiconductor manufacturing facilities) to meet target data 152, embodiments may also be generally applied to meeting target data. Embodiments may be generally applied to optimizing property data of products (e.g., of collinear property data).

Figure 2:
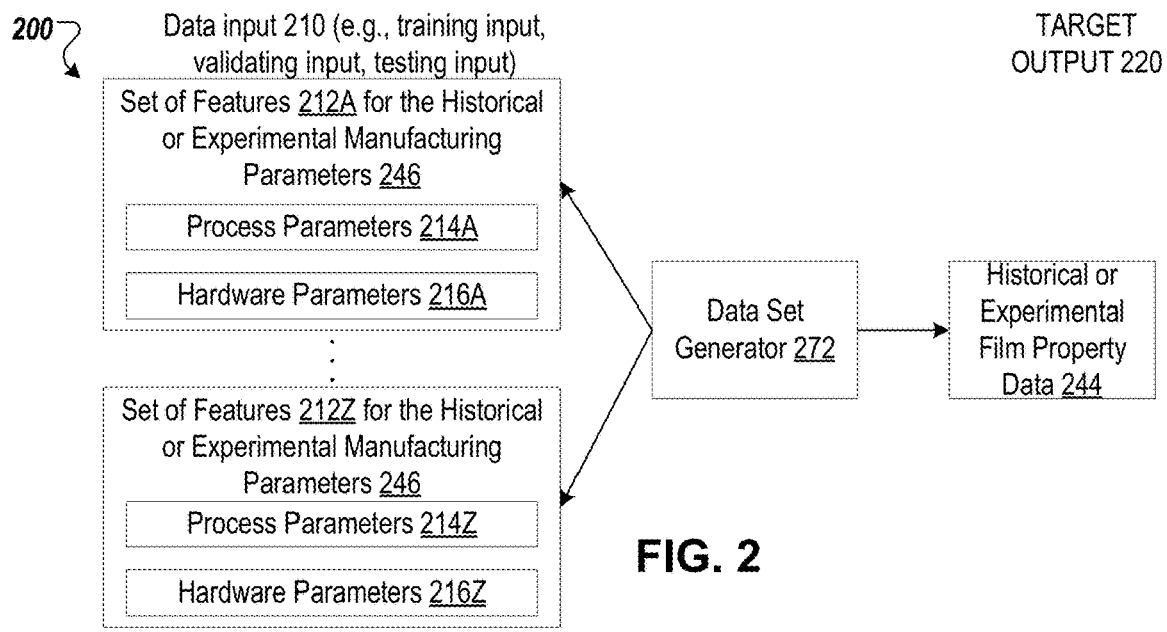
FIG. 2 is an example data set generator to create data sets for a machine learning model, according to certain embodiments.

FIG. 2 is an example data set generator 272 (e.g., data set generator 172 of FIG. 1) to create data sets for a machine learning model (e.g., model 190 of FIG. 1) using historical or experimental data 242 (e.g., historical or experimental data 142 of FIG. 1), according to certain embodiments. System 200 of FIG. 2 shows data set generator 272, data inputs 210, and target output 220.

In some embodiments, data set generator 272 generates a data set (e.g., training set, validating set, testing set) that includes one or more data inputs 210 (e.g., training input, validating input, testing input) and one or more target outputs 220 that correspond to the data inputs 210. The data set may also include mapping data that maps the data inputs 210 to the target outputs 220. Data inputs 210 may also be referred to as "features," "attributes," or information." In some embodiments, data set generator 272 may provide the data set to the training engine 182, validating engine 184, or testing engine 186, where the data set is used to train, validate, or test the machine learning model 190. Some embodiments of generating a training set may further be described with respect to FIG. 6.

In some embodiments, data inputs 210 may include one or more sets of features 212A for the historical or experimental manufacturing parameters 246 (e.g., historical or experimental manufacturing parameters 146 of FIG. 1). Each instance of historical or experimental manufacturing parameters 246 may include one or more of process parameters 214 or hardware parameters 216. Target output 220 may include historical or experimental film property data 244 (e.g., historical or experimental film property data 144 of FIG. 1).

In some embodiments, data set generator 272 may generate a first data input corresponding to a first set of features 212A to train, validate, or test a first machine learning model and the data set generator 272 may generate a second data input corresponding to a second set of features 212B to train, validate, or test a second machine learning model.

In some embodiments, the data set generator 272 may discretize one or more of the data input 210 or the target output 220 (e.g., to use in classification algorithms for regression problems). Discretization of the data input 210 or target output 220 may transform continuous values of variables into discrete values. In some embodiments, the discrete values for the data input 210 indicate discrete manufacturing parameters to obtain a target output 220.

Data inputs 210 and target outputs 220 to train, validate, or test a machine learning model may include information for a particular facility (e.g., for a particular semiconductor manufacturing facility). For example, the historical or experimental manufacturing parameters 246 and historical or experimental film property data 244 may be for the same manufacturing facility as the film property data 150, target data 152, updates to manufacturing parameters 154, and tested film property data 156.

In some embodiments, the information used to train the machine learning model may be from specific types of manufacturing equipment 124 of the manufacturing facility having specific characteristics and allow the trained machine learning model to determine outcomes for a specific group of manufacturing equipment 124 based on input for a certain target data 152 associated with one or more components sharing characteristics of the specific group. In some embodiments, the information used to train the machine learning model may be for components from two or more manufacturing facilities and may allow the trained machine learning model to determine outcomes for components based on input from one manufacturing facility.

In some embodiments, subsequent to generating a data set and training, validating, or testing machine learning model 190 using the data set, the machine learning model 190 may be further trained, validated, or tested (e.g., using updates to manufacturing parameters 154 and tested film property data 156 of FIG. 1) or adjusted (e.g., adjusting weights associated with input data of the machine learning model 190, such as connection weights in a neural network).

Figure 3:
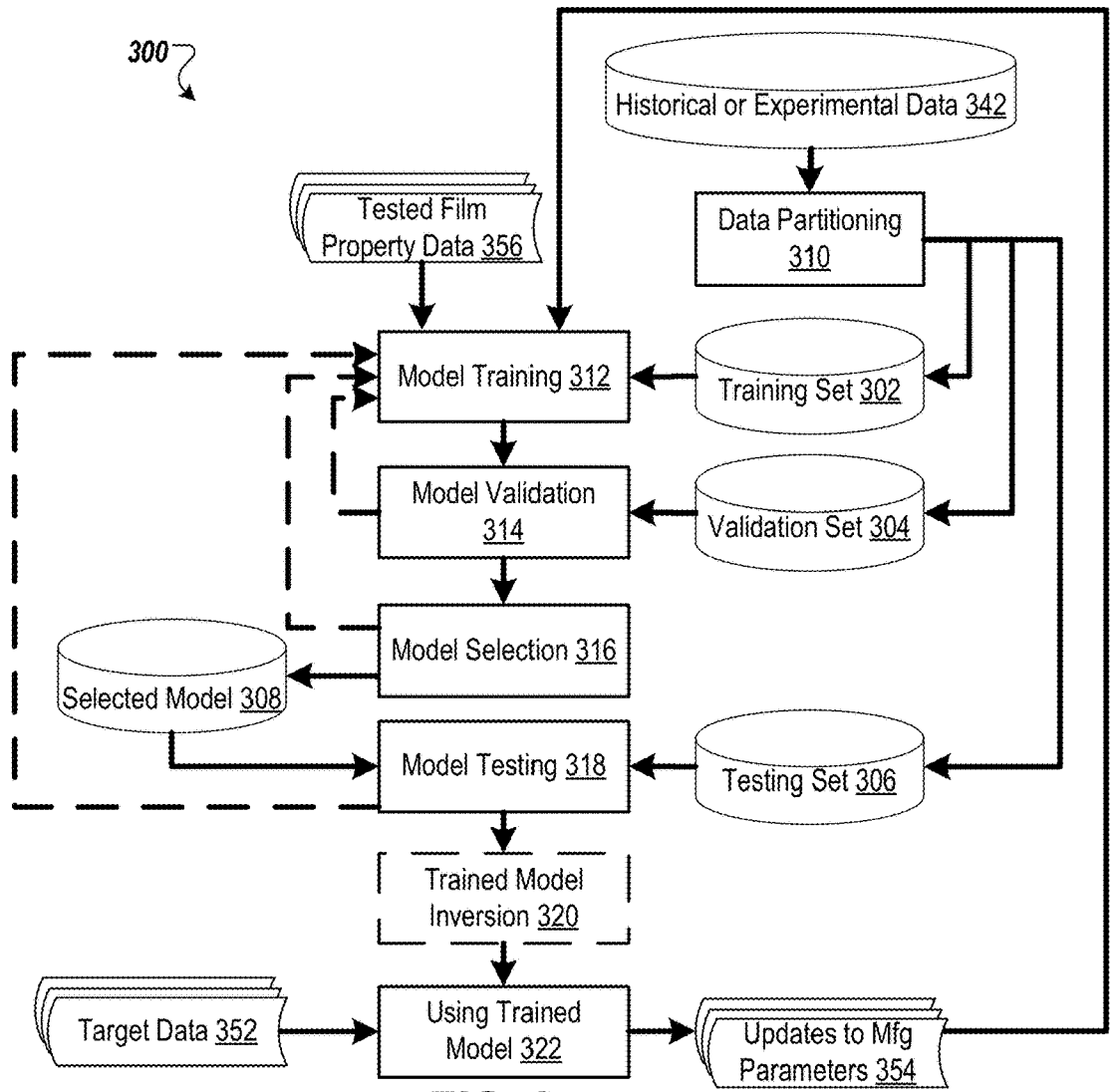
FIG. 3 is a block diagram illustrating determining updates to manufacturing parameters to meet target data, according to certain embodiments.

FIG. 3 is a block diagram illustrating a system 300 for generating updates to manufacturing parameters 354 (e.g., updates to manufacturing parameters 154 of FIG. 1), according to certain embodiments. The system 300 may be a feedback system for determining updates to manufacturing parameters 354 to meet target data 352 (e.g., target data 152 of FIG. 1) based on historical or experimental data 342 (e.g., historical or experimental data 142 of FIG. 1).

At block 310, the system 300 (e.g., prescriptive analytics system 110 of FIG. 1) performs data partitioning (e.g., via data set generator 172 of server machine 170 of FIG. 1) of the historical or experimental data 342 (e.g., historical or experimental data 142 of FIG. 1) to generate the training set 302, validation set 304, and testing set 306. For example, the training set may be 60% of the historical or experimental data 342, the validation set may be 20% of the historical or experimental data 342, and the testing set may be 20% of the historical or experimental data 342. The system 300 may generate a plurality of sets of features for each of the training set, the validation set, and the testing set. For example, if the historical or experimental data 342 has 20 manufacturing parameters (e.g., process parameters, hardware parameters) and 100 runs for each manufacturing parameter, a first set of features may be manufacturing parameters 1-10, a second set of features may be manufacturing parameters 11-20, the training set may be runs 1-60, the validation set may be runs 61-80, and the testing set may be runs 81-100. In this example, the first set of features of the training set would be manufacturing parameters 1-10 of runs 1-60.

At block 312, the system 300 performs model training (e.g., via training engine 182 of FIG. 1) using the training set 302. The system 300 may train multiple models using multiple sets of features of the training set 302 (e.g., a first set of features of the training set 302, a second set of features of the training set 302, etc.). For example, system 300 may train a machine learning model to generate a first trained machine learning model using the first set of features in the training set (e.g., manufacturing parameters 1-10 of runs 1-60) and to generate a second trained machine learning model using the second set of features in the training set (e.g., manufacturing parameters 11-20 of runs 1-60). In some embodiments, the first trained machine learning model and the second trained machine learning model may be combined to generate a third trained machine learning model (e.g., which may be a better predictor than the first or the second trained machine learning model on its own). In some embodiments, sets of features used in comparing models may overlap (e.g., first set of features being manufacturing parameters 1-15 and second set of features being manufacturing parameters 5-20). In some embodiments, hundreds of models may be generated including models with various permutations of features and combinations of models.

At block 314, the system 300 performs model validation (e.g., via validation engine 184 of FIG. 1) using the validation set 304. The system 300 may validate each of the trained models using a corresponding set of features of the validation set 304. For example, system 300 may validate the first trained machine learning model using the first set of features in the validation set (e.g., manufacturing parameters 1-10 of runs 61-80) and the second trained machine learning model using the second set of features in the validation set (e.g., manufacturing parameters 11-20 of runs 61-80). In some embodiments, the system 300 may validate hundreds of models (e.g., models with various permutations of features, combinations of models, etc.) generated at block 312. At block 314, the system 300 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 may discard the trained machine learning models that have an accuracy that is below the threshold accuracy (e.g., based on the validation set).

At block 316, the system 300 performs model selection (e.g., via selection engine 315) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow may return to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 may test, using the first set of features in the testing set (e.g., manufacturing parameters 1-10 of runs 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and not applicable to other data sets such as the testing set 306), flow continues to block 312 where the system 300 performs model training (e.g., retraining) using different training sets corresponding to different sets of features (e.g., different manufacturing parameters). Responsive to determining that the selected model 308 has an accuracy that meets a threshold accuracy based on the testing set 306, flow continues to block 320. In at least block 312, the model may learn patterns in the historical or experimental data 342 to make predictions and in block 318, the system 300 may apply the model on the remaining data (e.g., testing set 306) to test the predictions.

At block 320, system 300 inverts the trained model (e.g., selected model 308). For the trained model, responsive to input of manufacturing parameters, predicted film property data may be extracted from the output of the trained model. For the inverted trained model, responsive to input of target data 352 (e.g., target film property data), updates to manufacturing parameters 354 may be extracted from the output of the inverted trained model.

At block 322, system 300 uses the inverted trained model (e.g., selected model 308) to receive target data 352 (e.g., target film property data, target data 152 of FIG. 1) and extracts, from the output of the inverted trained model, updates to manufacturing parameters 354 (e.g., updates to manufacturing parameters 154 of FIG. 1).

Responsive to the manufacturing equipment 124 using the updates to manufacturing parameters 354 to produce products (e.g., semiconductors, wafers, etc.), the products may be tested (e.g., via measurement equipment 126) to determine tested film property data 356 (e.g., tested film property data 156 of FIG. 1). Responsive to receiving tested film property data 356, flow may continue to block 312 (e.g., via a feedback loop) where the updates to manufacturing parameters 354 and the tested film property data 356 are compared to update the trained model via model training (e.g., model retraining).

In some embodiments, one or more of the acts 310-322 may occur in various orders and/or with other acts not presented and described herein. In some embodiments, one or more of acts 310-322 may not be performed. For example, in some embodiments, one or more of data partitioning of block 310, model validation of block 314, model selection of block 316, or model testing of block 318 may not be performed.

Figure 4:
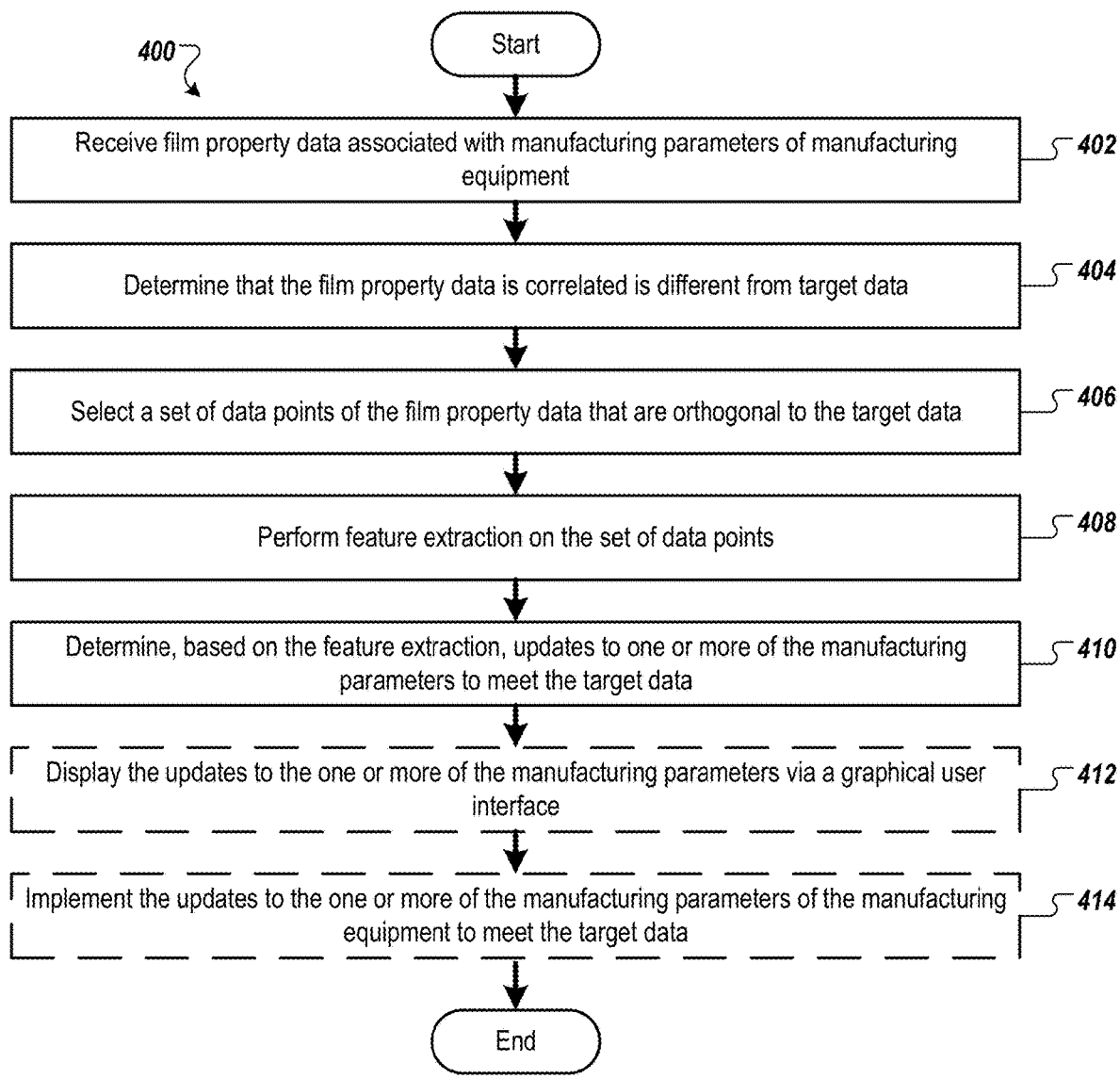
FIGS. 4-6 are flow diagrams illustrating example methods of determining updates to manufacturing parameters to meet target data, according to certain embodiments.
Figure 5:
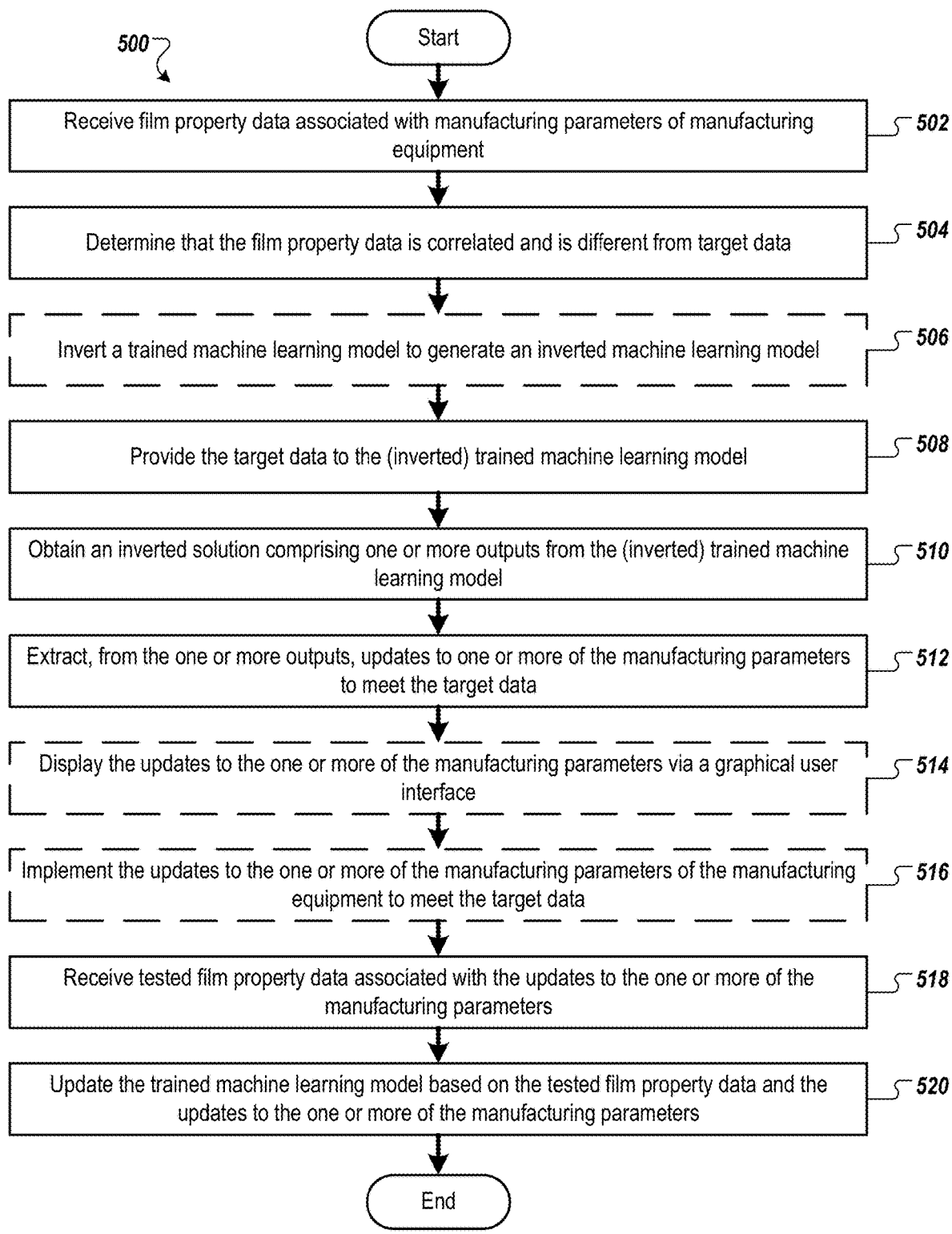
Figure 6:
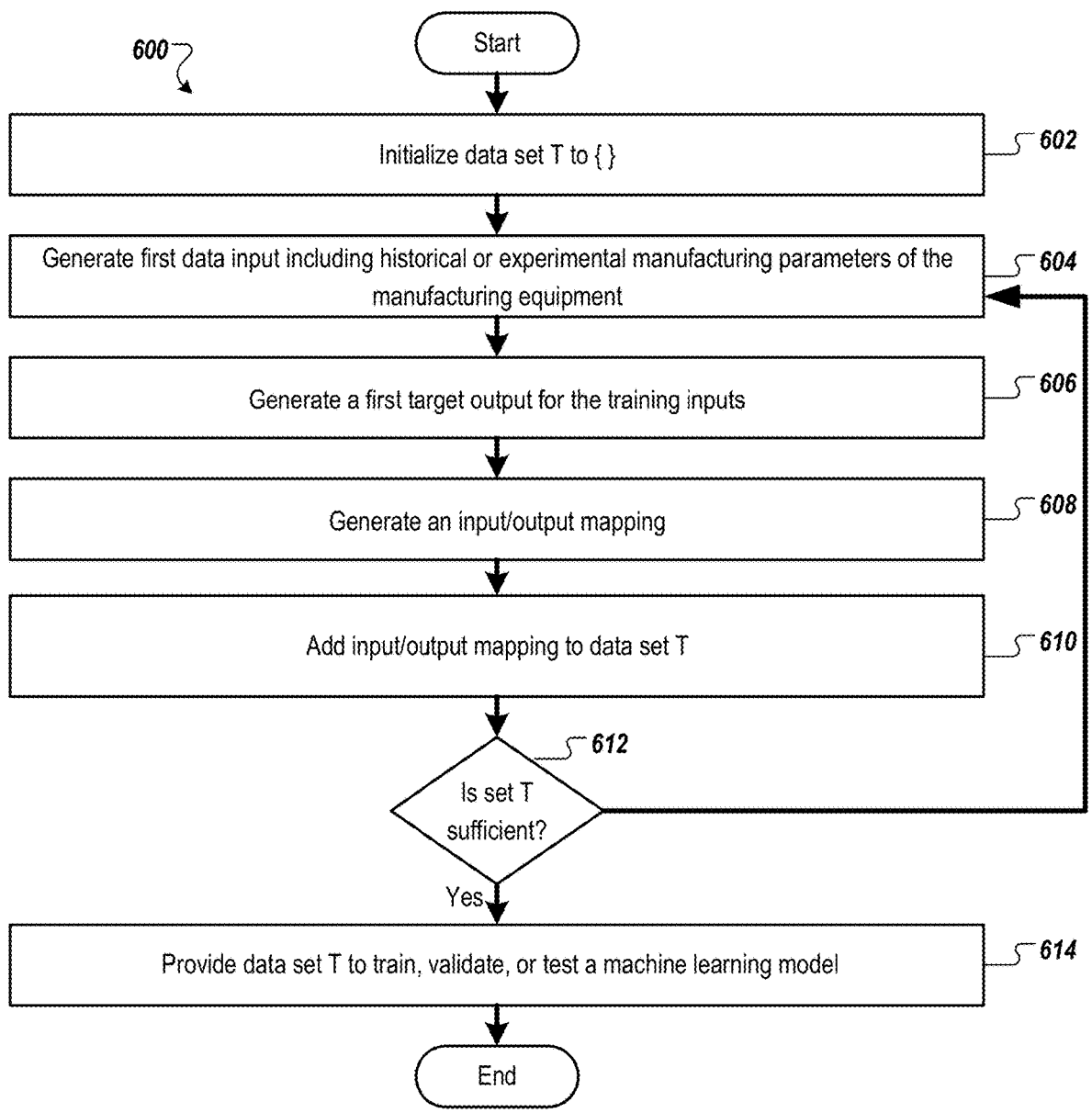

FIGS. 4-6 are flow diagrams illustrating example methods 400-600 associated with determining updates to manufacturing parameters (e.g., updates to manufacturing parameters 154 of FIG. 1), according to certain embodiments. Methods 400-600 may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In one embodiment, methods 400-600 may be performed, in part, by prescriptive analytics system 110. In some embodiments, methods 400-600 may be performed by prescriptive analytics server 130. In some embodiments, a non-transitory storage medium stores instructions that when executed by a processing device (e.g., of prescriptive analytics system 110) cause the processing device to perform methods 400-600.

For simplicity of explanation, methods 400-600 are depicted and described as a series of acts. However, acts in accordance with this disclosure can occur in various orders and/or concurrently and with other acts not presented and described herein. Furthermore, not all illustrated acts may be performed to implement the methods 400-600 in accordance with the disclosed subject matter. In addition, those skilled in the art will understand and appreciate that the methods 400-600 could alternatively be represented as a series of interrelated states via a state diagram or events.

FIG. 4 is a flow diagram of a method 400 for determining updates to manufacturing parameters (e.g., updates to manufacturing parameters 154 of FIG. 1) to meet target data (e.g., target data 152 of FIG. 1), according to certain embodiments.

Referring to FIG. 4, at block 402 the processing logic receives film property data 150 associated with manufacturing parameters of manufacturing equipment 124. In some embodiments, the client device 120 receives the film property data 150 from the measurement equipment 126 (e.g., metrology system 127). In some embodiments, the film property data 150 is measured via the measurement equipment 126 while the manufacturing equipment 124 is processing or generating the products (e.g., semiconductor wafers). In some embodiments, the film property data 150 is measured via the measurement equipment 126 after the manufacturing equipment 124 has processed the products (e.g., the completed semiconductor wafers, semiconductor wafers that have been through a stage of processing). The film property data 150 may correspond to a plurality of types of measurements via a plurality of types of measurement equipment 126. The prescriptive analytics component 132 may receive the film property data 150 from one or more of the client device 120, the measurement equipment 126, or the data store 140.

At block 404, the processing logic determines that the film property data 150 is correlated and is different from target data 152 (e.g., does not meet target data 152). In some embodiments, the processing logic determines that the film property data 150 does not intersect the target data 152 (e.g., the film property data 150 is substantially parallel to the target data 152).

Figure 7B:
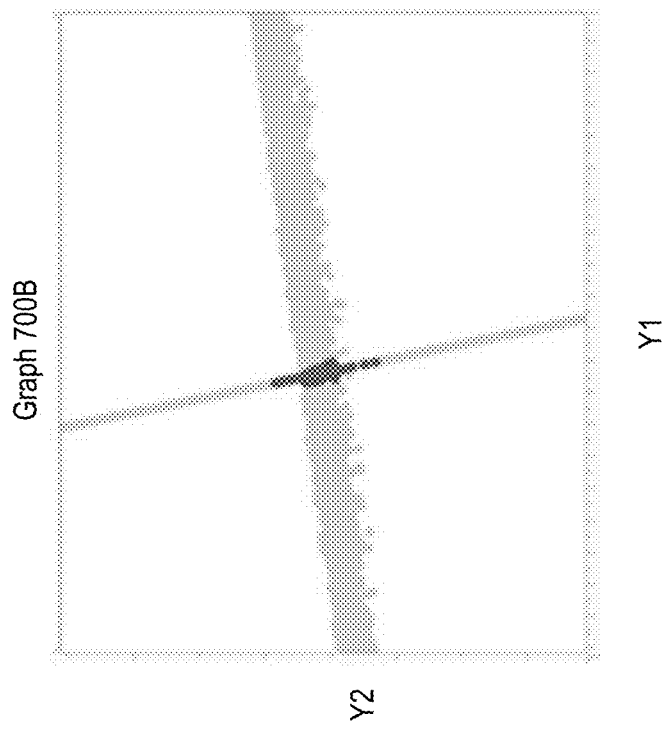
FIGS. 7A-B are graphs illustrating determining updates to manufacturing parameters to meet target data, according to certain embodiments.
Figure 7A:
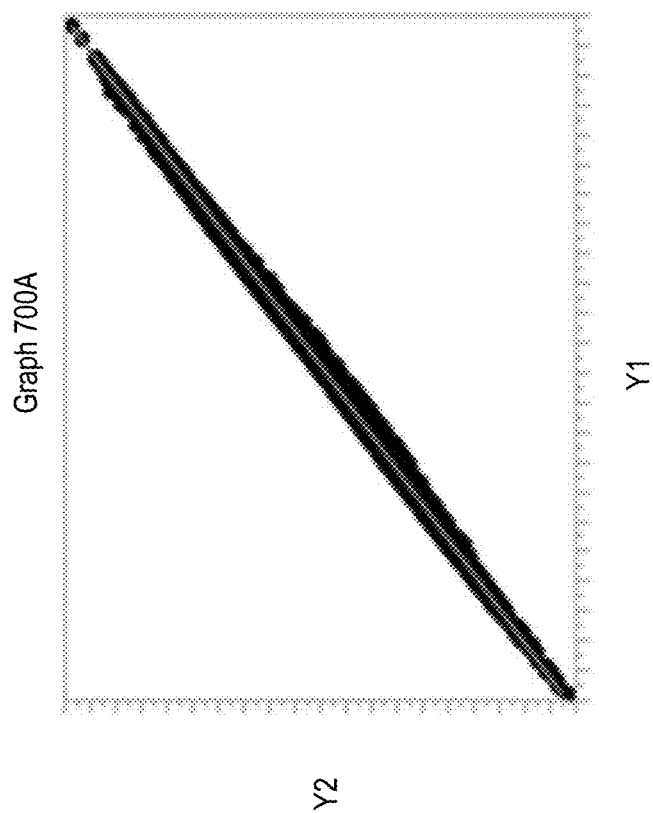

At block 406, the processing logic selects a set of data points of the film property data 150 that are orthogonal to the target data 152 (see FIG. 7A).

At block 408, the processing logic performs feature extraction on the set of data points. The performing of the feature extraction may be via one or more of principal component analysis (PCA), clustering (e.g., k-means clustering, hierarchical clustering), factor analysis (FA), discriminant analysis, or a correlation matrix.

At block 410, the processing logic determines, based on the feature extraction, updates to one or more of the manufacturing parameters (e.g., updates to manufacturing parameters 154) to meet the target data 152. The processing logic may filter solutions based on feasibility or cost of updates to manufacturing parameters 154 to meet the target data 152. For example, a first update or a second update to manufacturing parameters may cause the film property data to meet the target data 152. The first update may include changing process parameters (e.g., feasible, low cost) while the second update includes updating hardware parameters (e.g., ordering new manufacturing equipment, high cost). The first update may be used instead of the second update because of higher feasibility and lower cost.

At block 412, the processing logic displays the updates to the one or more of the manufacturing parameters 154 via a graphical user interface (GUI). The GUI may be displayed via the client device 120. The GUI may display two or more different options of updates to manufacturing parameters 154 to cause the film property data to meet target data 152. The GUI may indicate cost (e.g., of equipment upgrade, processing costs, time required, etc.) associated with the updates to manufacturing parameters 154 compared to current costs (e.g., increase in cost, decrease in cost, etc.). The GUI may display a GUI element that is selectable to select and implement updates to manufacturing parameters 154.

At block 414, the processing logic implements the updates to the one or more of the manufacturing parameters of the manufacturing equipment 124 to meet the target data 152. In some embodiments, block 414 is responsive to receiving user input selecting the GUI element to implement the updates to manufacturing parameters 154. In some embodiments, upon receiving user input selecting the GUI element, the process parameters of the manufacturing equipment 124 may be updated (e.g., by the client device 120, by the prescriptive analytics component 132, etc.). In some embodiments, upon receiving user input selecting the GUI element, the hardware parameters of the manufacturing equipment 124 may be updated (e.g., by changing components for the manufacturing equipment 124, by changing settings of the manufacturing equipment 124, etc.).

FIG. 5 is a flow diagram of a method 500 for using an inverted machine learning model to determine updates to manufacturing parameters (e.g., updates to manufacturing parameters 154) to meet target data 152, according to certain embodiments.

Referring to FIG. 5, at block 502 the processing logic receives film property data 150 associated with manufacturing parameters of manufacturing equipment 124.

At block 504, the processing logic determines that the film property data 150 is correlated and is different from target data 152 (e.g., does not meet target data 152). The film property data 150 may be correlated among two or more variables (e.g., multidimensional correlation). In some embodiments, desired output targets (e.g., target data 152 such as film properties including one or more of refractive index (RI), stress, uniformity, etc.) are highly collinear (e.g., substantially parallel to the film property data 150) and appear to not be achievable or plausible based on existing experimental data set (e.g., historical or experimental data 142) employed for learning/training. This may be due to one or more of narrow process space explored, hardware design limitations, right chemistry (e.g., reactants/precursors), etc.

In some embodiments, at block 506, the processing logic inverts a trained machine learning model to generate an inverted machine learning model. In some embodiments, at block 506, the processing logic generates a cost function that is similar to the trained machine learning model and the processing logic generates an inverted solution to the cost function. As described in relation to FIGS. 1-3, data input 210 (e.g., training data) may include historical or experimental data 142. The historical or experimental data 142 (e.g., historical or experimental film property data 144 and historical or experimental manufacturing parameters 146) may include process parameters, hardware parameters, curated paste excel files, classical designed schema of experiments, hardware component information, radio frequency (RF) hours, coordinate measuring machine (CMM) data, infrared (IR) data, color on array (COA) data, state data, design of experiment (DOE) data, etc. The data input 210 may be used as a training set for a statistical and/or machine learning model (e.g., a group of statistical and/or machine learning algorithms) to learn an approximation function (G) to a transfer function (F) that relates manufacturing parameters (S) (e.g., hardware and/or process parameters) to film property (P).

At block 506, an inverse operator may be used on function G for regression based methods. Simulations and optimization methods may be employed when closed form solution of G does not exist (e.g., neural networks, random forest, etc.). At block 508, the processing logic provides the target data 152 to the (inverted) trained machine learning model. The machine learning model may have been inverted or may have undergone a pseudo inversion (e.g., and inverted solution to a cost function similar to the machine learning model). The (inverted) trained machine learning model may select the set of data points of the film property data that are orthogonal to the target data and may perform feature extraction on the set of data points (see blocks 406-408 of FIG. 4). In some embodiments, the (inverted) trained machine learning model may use an orthonormal vector based principal component analysis (PCA) to prescribe a direction for process space exploration or hardware modification and design improvements.

As shown in FIG. 7A, high collinearity may exist between properties Y2 and Y1. As shown in graph 700B of FIG. 7B, an orthogonal line may pass through points ($Y_1^\circ$=D1, $Y_2^\circ$=D2) that constitute the set ($Y_1^\circ$, $Y_2^\circ$) defined by the distance metric d (e.g., distance from target data 152).

Thereafter, the predictor/input vectors $\{X^\circ\}$ may be identified that correspond to the simulated output parameters including (e.g., consisting of) $\{Y_1^\circ, Y_2^\circ\}$. Feature extraction (e.g., PCA) may be performed on the identified desirable predictor/input vectors $\{X^\circ\}$ to identify the principal components that account for variation (e.g., 90% of the variation, a majority of the variation) in the vector space $\{X^\circ\}$.

At block 510, the processing logic obtains an inverted solution including one or more outputs from the (inverted) trained machine learning model. In some embodiments, the inverted solution is obtained by inverting the trained machine learning model. In some embodiments, the inverted solutions is obtained by pseudo inversion (e.g., responsive to not being able to invert the trained machine learning model). Pseudo inversion may include generating a cost function (e.g., via a non-linear optimization technique) that is similar to the trained machine learning model and determining an inverted solution of the cost function to obtain the one or more outputs.

At block 512, the processing logic extracts, from the one or more outputs, updates to one or more of the manufacturing parameters 154 (e.g., prescriptions, inverse predictions) to meet the target data 152. In some embodiments, the processing logic extracts, from the one or more outputs, a level of confidence that products produced using the one or more updates to manufacturing parameters 154 are to meet the target data 152. The processing device may determine whether the level of confidence meets a threshold level of confidence. Responsive to the level of confidence meeting the threshold level of confidence, flow may continue to one or more of blocks 514 or 516.

At block 514, the processing logic displays the updates to the one or more of the manufacturing parameters via a graphical user interface (see block 412 of FIG. 4).

At block 516, the processing logic implements the updates to the one or more of the manufacturing parameters of the manufacturing equipment 124 to meet the target data 152 (see block 414 of FIG. 4).

At block 518, the processing logic receives tested film property data (e.g., tested film property data 156 of FIG. 1) associated with the updates to the one or more of the manufacturing parameters 154. The tested film property data 156 may indicate the actual film property data of products produced using the updates to manufacturing parameters 154.

At block 520, the processing logic updates the trained machine learning model based on the tested film property data 156 and the updates to the one or more of the manufacturing parameters 154. In some embodiments, responsive to the tested film property data 156 differing from the target data 152 (e.g., products produced using the updates to manufacturing parameters 154 not meeting target data 152), the processing logic may update the trained machine learning data with the tested film property data 156 and the updates to the one or more of the manufacturing parameters 154 (e.g., updating the historical or experimental data 142 by storing the tested film property data 156 in the historical or experimental film property data 144 and storing the updates to the manufacturing parameters 154 in the historical or experimental manufacturing parameters 146). The processing logic may update the trained machine learning model (e.g., re-train, re-validate, and/or re-test) based on the updated historical or experimental data.

FIG. 6 is a flow diagram of a method 600 for generating a data set for a machine learning model for determining updates to manufacturing parameters to meet target data, according to certain embodiments. Prescriptive analytics system 110 may use method 600 to at least one of train, validate, or test a machine learning model, in accordance with embodiments of the disclosure. In some embodiments, one or more operations of method 600 may be performed by data set generator 172 of server machine 170 as described with respect to FIGS. 1 and 2. It may be noted that components described with respect to FIGS. 1 and 2 may be used to illustrate aspects of FIG. 6.

Referring to FIG. 6, in some embodiments, at block 602 the processing logic implementing method 600 initializes a training set T to an empty set.

At block 604, processing logic generates first data input (e.g., first training input, first validating input) that includes historical or experimental manufacturing parameters (e.g., historical or experimental manufacturing parameters 146 of FIG. 1, historical or experimental manufacturing parameters 246 of FIG. 2). In some embodiments, the first data input may include a first set of features for historical or experimental manufacturing parameters and a second data input may include a second set of features for the historical or experimental manufacturing parameters (e.g., as described with respect to FIG. 2). In some embodiments, a third data input may include updates to manufacturing parameters (e.g., updates to manufacturing parameters 154 of FIG. 1, updates to manufacturing parameters 354 of FIG. 3).

At block 606, processing logic generates a first target output for one or more of the data inputs (e.g., first data input). The first target output provides an indication of film property data (e.g., historical or experimental film property data 144 of FIG. 1, historical or experimental film property data 244 of FIG. 2, tested film property data 156 of FIG. 1, tested film property data 356 of FIG. 3).

At block 608, processing logic optionally generates mapping data that is indicative of an input/output mapping. The input/output mapping (or mapping data) may refer to the data input (e.g., one or more of the data inputs described herein), the target output for the data input (e.g., where the target output identifies film property data), and an association between the data input(s) and the target output.

At block 610, processing logic adds the mapping data generated at block 610 to data set T.

At block 612, processing logic branches based on whether data set T is sufficient for at least one of training, validating, or testing machine learning model 190. If so, execution proceeds to block 614, otherwise, execution continues back at block 604. It should be noted that in some embodiments, the sufficiency of data set T may be determined based simply on the number of input/output mappings in the data set, while in some other implementations, the sufficiency of data set T may be determined based on one or more other criteria (e.g., a measure of diversity of the data examples, accuracy, etc.) in addition to, or instead of, the number of input/output mappings.

At block 614, processing logic provides data set T to train, validate, or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 614, machine learning model (e.g., machine learning model 190) can be at least one of trained using training engine 182 of server machine 180, validated using validating engine 184 of server machine 180, or tested using testing engine 186 of server machine 180. The trained machine learning model may be inverted and implemented by prescriptive analytics component 132 (of prescriptive analytics server 130) to determine updates to manufacturing parameters to meet target data.

FIGS. 7A-B are graphs 700A-B illustrating determining updates to manufacturing parameters to meet target data, according to certain embodiments.

Graph 700A of FIG. 7A illustrates high collinearity between properties Y2 and Y1. Client device 120 may receive film property data from measurement equipment 126 (e.g., metrology system 127) coupled to manufacturing equipment 124. Client device 120 may receive first film property data corresponding to a first property from a first portion of measurement equipment 126A and second film property data corresponding to a second property from a second portion of measurement equipment 126B. In some embodiments, the first film property data and the second film property data may be different types of properties. In some embodiments, the first film property data and the second film property data are the same type of property measured at different locations (e.g., one measured on a first surface and another measured on a second surface) of a semiconductor wafer.

Client device 120 may plot the first property data and the second property data in graph 700A. Each point on graph 700A may correspond to a value of a first property (Y1) and a value of a second property (Y2) measured at the same time of the same product (e.g., semiconductor wafer). As illustrated in graph 700A, the film property data plotted for a first property and a second property may be correlated (e.g., linear, collinear, Y1 and Y2 may at least partially explain each other). The film property data that is correlated may substantially form a line of film property data on the graph 700A. The film property data that is correlated may meet a threshold coefficient of determination value ($R^2$ or Rsq) (e.g., Rsq>0.8). The film property data that is correlated may meet a threshold Spearman's rank correlation coefficient value. The Spearman's rank correlation coefficient may be a nonparametric measure of rank correlation (e.g., statistical dependence between ranks of first property (Y1) and second property (Y2)). The film property data that is correlated may meet a threshold P-value. The P-value may be a probability for a given statistical model (line fit between Y1 and Y2) that, when the null hypothesis is true, the statistical summary (e.g. no linear dependence between Y1 and Y2) would be greater than or equal to the actual observed results. In some embodiments, the target data 152 plotted for a first property (Y1) and a second property (Y2) may be substantially parallel to film property data 150 plotted for Y1 and Y2.

Graph 700B of FIG. 7B illustrates an orthogonal line passing through points that constitute the set defined by a distance metric. As shown in graph 700B of FIG. 7B, a line orthogonal (e.g., perpendicular, orthonormal) to the line formed by plotting the target data 152 may intersect a set of points of the film property data. One or more first points of the set of points may be closer to the plot of the target data 152 than one or more second points of the set of points. The one or more first points may correspond to first manufacturing parameters and the one or more second points may correspond to second manufacturing parameters that are different from the first manufacturing parameters. Feature extraction can be performed on the set of data points to determine one or more manufacturing parameters that cause the first points of the set of points to be closer to the target data 152 than the second points. Updates to the one or more manufacturing parameters 154 may be determined to cause the set of points to meet the target data 152 based on the feature extraction.

In some embodiments, the selecting of the set of data points that are orthogonal to the target data 152 and performing feature extraction on the set of data points is performed via an inverted trained machine learning model. In some embodiments, the selecting of the set of data points that are orthogonal to the target data 152 and performing feature extraction on the set of data points is performed via prescriptive analytics (e.g., statistical model, clustering, etc.) that does not use a machine learning model.

Figure 8:
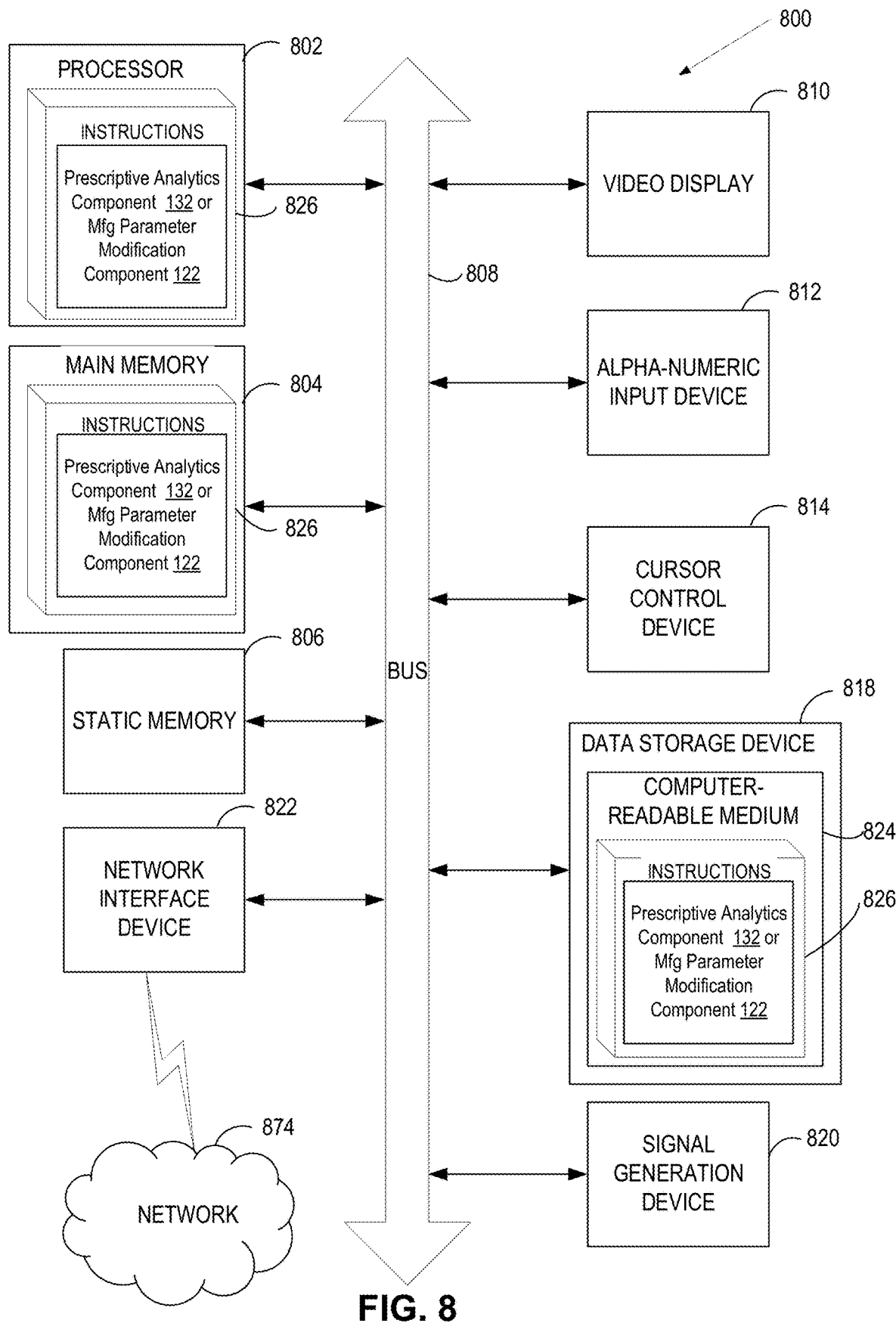
FIG. 8 is a block diagram illustrating a computer system, according to certain embodiments.

FIG. 8 is a block diagram illustrating a computer system 800, according to certain embodiments. In some embodiments, computer system 800 may be connected (e.g., via a network, such as a Local Area Network (LAN), an intranet, an extranet, or the Internet) to other computer systems. Computer system 800 may operate in the capacity of a server or a client computer in a client-server environment, or as a peer computer in a peer-to-peer or distributed network environment. Computer system 800 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 800 may include a processing device 802, a volatile memory 804 (e.g., random access memory (RAM)), a non-volatile memory 806 (e.g., read-only memory (ROM) or electrically-erasable programmable ROM (EEPROM)), and a data storage device 816, which may communicate with each other via a bus 808.

Processing device 802 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 800 may further include a network interface device 822. Computer system 800 also may include a video display unit 810 (e.g., an LCD), an alphanumeric input device 812 (e.g., a keyboard), a cursor control device 814 (e.g., a mouse), and a signal generation device 820.

In some implementations, data storage device 816 may include a non-transitory computer-readable storage medium 824 on which may store instructions 826 encoding any one or more of the methods or functions described herein, including instructions encoding the prescriptive analytics component 132 or manufacturing parameter modification component 122 of FIG. 1 and for implementing methods described herein.

Instructions 826 may also reside, completely or partially, within volatile memory 804 and/or within processing device 802 during execution thereof by computer system 800, hence, volatile memory 804 and processing device 802 may also constitute machine-readable storage media.

While computer-readable storage medium 824 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "determining," "selecting," "performing," "training," "generating," "providing," "inverting," "obtaining," "implementing," "displaying," "optimizing," "non-linear optimizing," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   receiving first film property data of first substrates produced by manufacturing equipment based on manufacturing parameters, the first film property data comprising first film property values of a first film property type and second film property values of a second film property type that is different from the first film property type;
   identifying target film property data comprising first target film property values of the first film property type and second target film property values of the second film property type;
   determining that the first film property values and the second film property values are substantially correlated along a first line that is different from a second line, the first target values and the second target values being substantially correlated substantially along the second line;
   selecting, by a processing device, a set of data points of the first film property data that are associated with a third line that is substantially orthogonal to the second line associated with the target film property data; and
   determining, based on the set of data points, updates to one or more of the manufacturing parameters to generate updated manufacturing parameters, wherein second substrates are to be produced by the manufacturing equipment based on the updated manufacturing parameters to meet the target film property data.

2. The method of claim 1, wherein the manufacturing parameters comprise one or more of hardware parameters or process parameters.

3. The method of claim 1, wherein:
the first film property data is disposed substantially along the first line that is plotted on a graph that has a first axis corresponding to the first film property type and a second axis corresponding to the second film property type;
the target film property data is disposed substantially along the second line that is plotted on the graph;
the set of data points are disposed along the third line plotted on the graph; and
the third line is substantially orthogonal to the second line on the graph.

4. The method of claim 1 further comprising performing feature extraction on the set of data points, wherein the determining of the updates is further based on the feature extraction, and wherein the performing of the feature extraction is via one or more of principal component analysis (PCA), clustering, factor analysis (FA), discriminant analysis, or correlation matrix.

5. The method of claim 1 further comprising training a machine learning model to generate a trained machine learning model for the determining of the updates to the one or more of the manufacturing parameters, wherein the training comprises:
generating training data for the machine learning model, wherein the generating of the training data comprises:
generating first training input comprising historical manufacturing parameters of the manufacturing equipment; and
generating first target output for the first training input, wherein the first target output comprises historical film property data; and
providing the training data to train the machine learning model on (i) a set of training inputs comprising the first training input, and (ii) a set of target outputs comprising the first target output.

6. The method of claim 5 further comprising:
providing the target film property data to the trained machine learning model, wherein the selecting of the set of data points is via the trained machine learning model; and
obtaining an inverted solution comprising one or more outputs from the trained machine learning model, wherein the determining of the updates comprises extracting, from the one or more outputs, the updates to the one or more of the manufacturing parameters.

7. The method of claim 1 further comprising causing the second substrates to be produced by the manufacturing equipment based on the updated manufacturing parameters to meet the target film property data.

8. The method of claim 1 further comprising displaying the updates to the one or more of the manufacturing parameters via a graphical user interface.

9. A system comprising:
a memory; and
a processing device, coupled to the memory, to:
receive first film property data of first substrates produced by manufacturing equipment based on manufacturing parameters, the first film property data comprising first film property values of a first film property type and second film property values of a second film property type that is different from the first film property type;
identify target film property data comprising first target film property values of the first film property type and second target film property values of the second film property type
determine that the first film property values and the second film property values are substantially correlated along a first line that is different from a second line, the first target values and the second target values being substantially correlated substantially along the second line;
select a set of data points of the first film property data that are associated with a third line that is substantially orthogonal to the second line associated with the target film property data; and
determine, based on the set of data points, updates to one or more of the manufacturing parameters to generate updated manufacturing parameters, wherein second substrates are to be produced by the manufacturing equipment based on the updated manufacturing parameters to meet the target film property data.

10. The system of claim 9, wherein the first line and the second line are substantially parallel.

11. The system of claim 9, wherein:
the manufacturing parameters comprise one or more of hardware parameters or process parameters;
the processing device is to perform feature extraction on the set of data points via one or more of principal component analysis (PCA), clustering, factor analysis (FA), discriminant analysis, or correlation matrix; and
the processing device is to determine the updates further based on the feature extraction.

12. The system of claim 9, wherein the processing device is further to train a machine learning model to generate a trained machine learning model to determine the updates to the one or more of the manufacturing parameters, wherein to train the machine learning model, the processing device is to:
generate training data for the machine learning model, wherein to generate the training data, the processing device is to:
generate first training input comprising historical manufacturing parameters of the manufacturing equipment; and
generate first target output for the first training input, wherein the first target output comprises historical film property data; and
provide the training data to train the machine learning model on (i) a set of training inputs comprising the first training input, and (ii) a set of target outputs comprising the first target output.

13. The system of claim 12, wherein the processing device is further to:
provide the target film property data to the trained machine learning model, wherein the processing device is to select the set of data points and perform feature extraction via the trained machine learning model; and
obtain an inverted solution comprising one or more outputs from the trained machine learning model, wherein to determine the updates, the processing device is to extract, from the one or more outputs, the updates to the one or more of the manufacturing parameters.

14. The system of claim 9, wherein the processing device is further to one or more of:
cause the second substrates to be produced by the manufacturing equipment based on the updated manufacturing parameters to meet the target film property data; or display the updates to the one or more of the manufacturing parameters via a graphical user interface.

15. A non-transitory computer readable medium having instructions stored thereon, which, when executed by a processing device, cause the processing device to:
    receive first film property data of first substrates produced by manufacturing equipment based on manufacturing parameters, the first film property data comprising first film property values of a first film property type and second film property values of a second film property type that is different from the first film property type;
    identify target film property data comprising first target film property values of the first film property type and second target film property values of the second film property type;
    determine that the first film property values and the second film property values are substantially correlated along a first line that is different from a second line, the first target values and the second target values being substantially correlated substantially along the second line;
    select a set of data points of the first film property data that are associated with a third line that is substantially orthogonal to the second line associated with the target film property data; and
    determine, based on the set of data points, updates to one or more of the manufacturing parameters to generate updated manufacturing parameters, wherein second substrates are to be produced by the manufacturing equipment based on the updated manufacturing parameters to meet the target film property data.

16. The non-transitory computer readable medium of claim 15, wherein the first line and the second line are substantially parallel.

17. The non-transitory computer readable medium of claim 15, wherein:
    the manufacturing parameters comprise one or more of hardware parameters or process parameters;
    the processing device is to perform feature extraction on the set of data points via one or more of principal component analysis (PCA), clustering, factor analysis (FA), discriminant analysis, or correlation matrix; and the processing device is to determine the updates further based on the feature extraction.

18. The non-transitory computer readable medium of claim 15, wherein the processing device is further to train a machine learning model to generate a trained machine learning model to determine the updates to the one or more of the manufacturing parameters, wherein to train the machine learning model, the processing device is to:
    generate training data for the machine learning model, wherein to generate the training data, the processing device is to:
        generate first training input comprising historical manufacturing parameters of the manufacturing equipment; and
        generate first target output for the first training input, wherein the first target output comprises historical film property data; and
    provide the training data to train the machine learning model on (i) a set of training inputs comprising the first training input, and (ii) a set of target outputs comprising the first target output.

19. The non-transitory computer readable medium of claim 18, wherein the processing device is further to:
    provide the target film property data to the trained machine learning model, wherein the processing device is to select the set of data points via the trained machine learning model; and
    obtain an inverted solution comprising one or more outputs from the trained machine learning model, wherein to determine the updates, the processing device is to extract, from the one or more outputs, the updates to the one or more of the manufacturing parameters.

20. The non-transitory computer readable medium of claim 15, wherein the processing device is further to one or more of:
    cause the second substrates to be produced by the manufacturing equipment based on the updated manufacturing parameters to meet the target film property data; or
    display the updates to the one or more of the manufacturing parameters via a graphical user interface.

* * * * *